(12) United States Patent
Hadidi et al.

(10) Patent No.: US 8,344,318 B2
(45) Date of Patent: Jan. 1, 2013

(54) TECHNIQUE FOR MONITORING AND CONTROLLING A PLASMA PROCESS WITH AN ION MOBILITY SPECTROMETER

(75) Inventors: Kamal Hadidi, Somerville, MA (US); Bernard G. Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 516 days.

(21) Appl. No.: 12/556,592

(22) Filed: Sep. 10, 2009

(65) Prior Publication Data
US 2010/0062547 A1 Mar. 11, 2010

Related U.S. Application Data

(60) Provisional application No. 61/096,168, filed on Sep. 11, 2008.

(51) Int. Cl.
*H01L 21/66* (2006.01)
(52) U.S. Cl. ........ 250/288; 250/281; 250/282; 250/283; 250/286; 250/287; 438/5; 438/14
(58) Field of Classification Search .......... 250/281–300; 438/5, 14
See application file for complete search history.

(56) References Cited

U.S. PATENT DOCUMENTS

| | | | | |
|---|---|---|---|---|
| 4,362,936 A | * | 12/1982 | Hofmann et al. | ............. 250/292 |
| 5,482,684 A | * | 1/1996 | Martens et al. | ............... 422/119 |
| 6,521,082 B1 | * | 2/2003 | Barnes et al. | ............ 156/345.46 |
| 6,676,804 B1 | * | 1/2004 | Koshimizu et al. | ...... 156/345.53 |
| 6,683,299 B2 | | 1/2004 | Fuhrer et al. | |
| 7,019,286 B2 | | 3/2006 | Fuhrer et al. | |
| 7,084,395 B2 | | 8/2006 | Fuhrer et al. | |
| 7,601,619 B2 | * | 10/2009 | Okumura et al. | ............. 438/513 |
| 2002/0029851 A1 | * | 3/2002 | Edamura et al. | .............. 156/345 |
| 2003/0150560 A1 | * | 8/2003 | Kinnard et al. | ........... 156/345.33 |
| 2005/0034811 A1 | * | 2/2005 | Mahoney et al. | ........ 156/345.24 |
| 2005/0036268 A1 | * | 2/2005 | Howald et al. | ................. 361/234 |
| 2005/0051272 A1 | * | 3/2005 | Collins et al. | ............ 156/345.48 |
| 2005/0085740 A1 | * | 4/2005 | Davis et al. | .................... 600/532 |
| 2005/0236364 A1 | * | 10/2005 | Kagoshima et al. | ............ 216/59 |
| 2006/0138317 A1 | * | 6/2006 | Schultz et al. | ................ 250/287 |
| 2008/0075834 A1 | * | 3/2008 | Ramaswamy et al. | ............ 427/8 |
| 2008/0156981 A1 | * | 7/2008 | Miller et al. | .................. 250/287 |
| 2009/0039282 A1 | * | 2/2009 | Haase et al. | .............. 250/423 R |
| 2010/0025369 A1 | * | 2/2010 | Negishi et al. | .................. 216/60 |

FOREIGN PATENT DOCUMENTS

JP H06-232089 A 8/1994
JP 11330052 A * 11/1999

* cited by examiner

*Primary Examiner* — Michael Logie

(57) ABSTRACT

A plasma processing apparatus includes a process chamber, a platen positioned in the process chamber for supporting a workpiece, a source configured to generate a plasma in the process chamber, and a monitoring system including an ion mobility spectrometer configured to monitor a condition of the plasma. A monitoring method including generating a plasma in a process chamber of a plasma processing apparatus, supporting a workpiece on a platen in the process chamber, and monitoring a condition of the plasma with an ion mobility spectrometer is also provided.

14 Claims, 3 Drawing Sheets

US 8,344,318 B2

TECHNIQUE FOR MONITORING AND CONTROLLING A PLASMA PROCESS WITH AN ION MOBILITY SPECTROMETER

CROSS REFERENCE TO RELATED APPLICATIONS

This patent application claims priority to U.S. Provisional Patent Application No. 61/096,168, filed Sep. 11, 2008, which is incorporated by reference herein in its entirety.

FIELD

This disclosure relates generally to plasma processing, and more particularly to a technique for monitoring and controlling a plasma process using ion mobility spectrometry.

BACKGROUND

Plasma processes are widely used, for example, in semiconductor manufacturing to implant wafers with various dopants, to deposit or to etch. In order to achieve predictable and repeatable process results, it is critical to closely monitor and control the plasma characteristics. For example, plasma processes inherently produce ionic and neutral species. In a plasma doping (PLAD) process, such ionic and neutral species may react and deposit on surfaces such as the walls of the process chamber and the workpiece to be treated. Such ionic and neutral species may also react and etch such surfaces. In addition, studies of PLAD processes have shown that ion composition of a plasma may be a critical piece of information that determines dopant species, dopant depth profiles, process-related contamination, etc. The ion composition changes with PLAD process parameters such as gas ratio, total gas pressure, and discharge power. The ion composition can also change significantly depending on the conditioning status of a plasma chamber. Therefore, it is important to know the ion composition during a PLAD process, preferably in situ and in real-time, in order to achieve repeatable and predictable process results.

One conventional method of monitoring plasma conditions includes optical diagnostic techniques such as optical emission spectroscopy to monitor plasma constituents. However, a drawback with such optical diagnostic techniques is that they require transparent optical input and viewing ports. The transparency of these ports tends to degrade over time as deposits build up on the same. Another conventional method of monitoring plasma conditions includes residual gas analyzers (RGA) and mass spectrometers such as a time-of-flight mass spectrometer to monitor the plasma. However, a drawback to RGAs and mass spectrometers is that they typically require two to three orders magnitude of a lower vacuum environment than the pressure in a typical plasma processing chamber. This would then require differential pumping to achieve the desired pressure and the possibility of reactions between the ions and neutrals before they are analyzed can degrade the monitored results. In addition, the mass spectrometers tend to be bulky and may therefore perturb plasma under measurement which could distort process results. The bulkiness of mass spectrometers may also limit their deployment locations in a semiconductor process tool. In addition, a time-of-flight mass spectrometer does not ionize neutral particles so it does not monitor the same. Furthermore, a time-of-flight sensor can also not distinguish between two ions having the same mass which can further degrade the monitored results.

Accordingly, it would be desirable to provide a technique for monitoring a plasma process with an ion mobility spectrometer which overcomes the above-described inadequacies and shortcomings.

SUMMARY

According to a first aspect of the disclosure a plasma processing apparatus is provided. The plasma processing apparatus includes a process chamber, a platen positioned in the process chamber for supporting a workpiece, a source configured to generate a plasma in the process chamber, and a monitoring system comprising an ion mobility spectrometer configured to monitor a condition of the plasma.

According to yet another aspect of the disclosure, a monitoring method is provided. The monitoring method includes generating a plasma in a process chamber of a plasma processing apparatus, supporting a workpiece on a platen in the process chamber, and monitoring a condition of the plasma with an ion mobility spectrometer.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
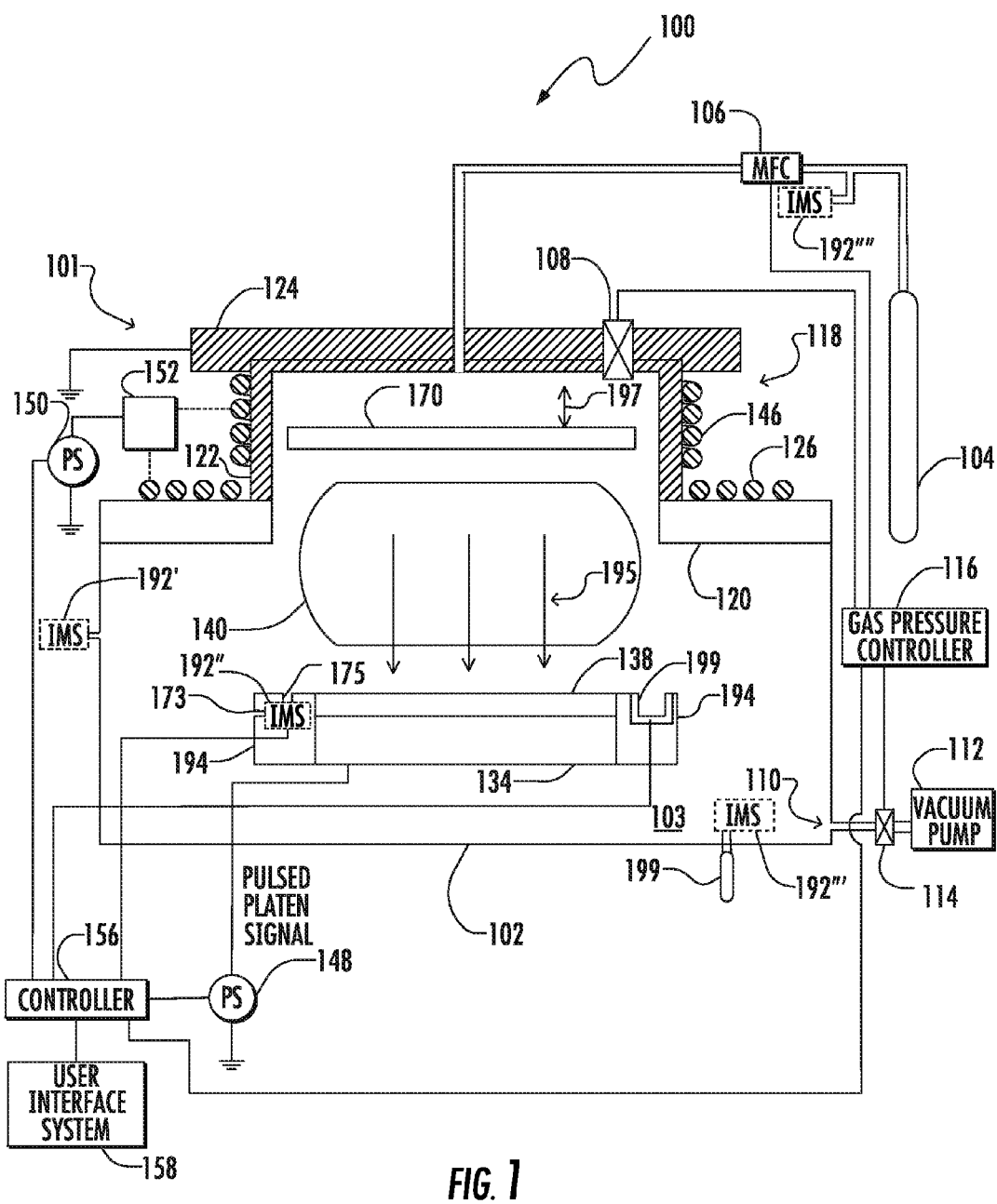
FIG. 1 is a block diagram of a plasma processing apparatus consistent with an embodiment of the disclosure.

Turning to FIG. 1, a block diagram of a plasma processing apparatus 100 consistent with the present disclosure is illustrated having at least one ion mobility spectrometer (IMS) 192 to monitor a condition of plasma 140. In the embodiment of FIG. 1, the plasma processing apparatus 100 is a plasma doping (PLAD) system and will be described as such herein. A monitoring system having at least one IMS 192 may also be utilized in other plasma processing apparatus including, but not limited to, etching and deposition systems.

The plasma doping system of FIG. 1 includes a process chamber 102 defining an enclosed volume 103. The process chamber 102 may be cooled or heated by a temperature regulation system (not illustrated). A platen 134 may be positioned in the process chamber 102 to support a workpiece 138. In one instance, the workpiece 138 may be a semiconductor wafer having a disk shape, e.g., a 300 millimeter (mm) diameter silicon wafer in one embodiment. The workpiece 138 may be clamped to a flat surface of the platen 134 by electrostatic or mechanical forces. In one embodiment, the platen 134 may include conductive pins (not shown) for making connection to the workpiece 138.

A gas source 104 provides a feed gas to the interior volume 103 of the process chamber 102 through the mass flow controller 106. There may be a plurality of additional gas sources (not illustrated) to provide a plurality of additional gases. A gas baffle 170 is positioned in the process chamber 102 to deflect the flow of gas from the gas source 104. The gas baffle 170 may also be movable in a direction perpendicular to the platen 134 as indicated by arrow 197. A pressure gauge 108 measures the pressure inside the process chamber 102. A vacuum pump 112 evacuates exhausts from the process chamber 102 through an exhaust port 110 in the process chamber 102. An exhaust valve 114 controls the exhaust conductance through the exhaust port 110.

The plasma doping system may further includes a gas pressure controller 116 that is electrically connected to the mass flow controller 106, the pressure gauge 108, the exhaust valve 114, and the controller 156. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108 and the controller 156.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction. In some embodiments, the lid 124 may include a cooling system in order to dissipate a heat load generated during processing.

The plasma doping system may further include a source 101 configured to generate a plasma 140 within the process chamber 102. The source 101 may include a RE source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma doping system may also include a bias source 148 electrically coupled to the platen 134. The bias source 148 is configured to provide a pulsed platen signal having pulse ON and OFF time periods to bias the platen 134, and hence the workpiece 138, to accelerate ions from the plasma 140 towards the workpiece 138 during the pulse ON time periods and not during the pulse OFF periods. The bias source 148 may be a DC or an RF power supply (PS).

A shield ring 194 may be disposed around the platen 134. As is known in the art, the shield ring 194 may be biased to improve the uniformity of implanted ion distribution near the edge of the workpiece 138. One or more Faraday sensors such as Faraday cup 199 may also be positioned in the shield ring 194 to sense ion beam current. The Faraday sensor may also include an annular Faraday sensor or segmented annular Faraday sensors positioned around the workpiece 138.

The plasma doping system may further include a controller 156 and a user interface system 158. The controller 156 can be or include a general-purpose computer or network of general-purpose computers that may be programmed to perform desired input/output functions. The controller 156 can also include other electronic circuitry or components, such as application specific integrated circuits, other hardwired or programmable electronic devices, discrete element circuits, etc. The controller 156 may also include communication devices, data storage devices, and software. For clarity of illustration, the controller 156 is illustrated as providing an output signal to the power supplies 148, 150 and gas pressure controller 116, and receiving input signals from the ion mass spectrometer 192, the Faraday cup 199, and the gas pressure controller 116. Those skilled in the art will recognize that the controller 156 may provide output signals to other components of the plasma doping system and receive input signals from the same. The user interface system 158 may include devices such as touch screens, keyboards, user pointing devices, displays, printers, etc. to allow a user to input commands and/or data and/or to monitor the plasma doping system via the controller 156.

Advantageously, the plasma doping system includes a monitoring system having at least one ion mass spectrometer (IMS) 192. The IMS 192 may be installed in a position to monitor a condition of the plasma 140 and/or the feed gas from the gas source 104 during processing of the workpiece 138. When monitoring the plasma 140, the IMS 192 may continuously monitor an ion composition and/or a neutral composition of the plasma 140. When monitoring the feed gas, the IMS 192 may continuously monitor a condition of the feed gas such as the concentration of the feed gas input to the process chamber 102 from the gas source 104. In response to monitored conditions of the plasma 140, the controller 156 may control one or more process parameters of the plasma doping system. Therefore, more repeatable and predictable process results may be obtained. In one example, undesirable deposition may be limited and uniformity of dose into the workpiece 138 can be improved.

In addition to monitoring the plasma 140, an IMS 192 may be positioned to continuously monitor, in real time, the concentration of the input feed gas from the gas source 104. For example, the IMS 192 may be installed in position 192'''' before the mass flow controller 106 to monitor the input feed gas. In cases where process gases are not stable, for example due to polymerization or decomposition, or where a gas mixture is used, it is desirable to continuously monitor the concentration of the input process gas and to adjust it to maintain the required concentration. For example, a diborane gas may have its concentration change over time due to polymerization. This also helps achieve repeatable and predictable process results.

FIG. 1 also illustrates some different installation options for the IMS 192 to monitor the plasma 140. In one position 192', the IMS 192 may be installed in a sidewall of the plasma chamber 102. The installation may be through a view port or similar mechanism. In another position 192'', the IMS 192 may be positioned proximate the workpiece 138. In this instance, the IMS may be positioned in the shield ring 194 or the platen. An entrance aperture 173 may be positioned on an exterior sidewall of the shield ring 194 or a different entrance aperture 175 may be positioned on a surface of the shield ring 194 facing the plasma 140. In yet another position 192''', the IMS 192 may be positioned in the interior volume 103 defined by the process chamber 102 along a process gas path to the vacuum pump 112. To monitor the feed gas composition, another IMS 192 may be installed at position 192'''' just before the mass flow controller 106. The IMS 192 may also be installed in other locales and one or more IMSs 192 may be utilized for both plasma monitoring and input feed gas monitoring.

In operation, the gas source 104 supplies a feed gas containing a desired dopant for implantation into the workpiece 138. Examples of feed gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_5$, $PF_3$, and $PF_5$. The gas pressure controller 116 regulates the rate at which the feed gas is supplied to the process chamber 102 and the concentration of the same. The gas pressure controller 116 may be further regulated by the controller 126. The source 101 is configured to generate the plasma 140 within the process chamber 102.

The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the feed gas to generate the plasma 140.

The bias source 148 provides a pulsed platen signal to bias the platen 134 and hence the workpiece 138 to accelerate ions from the plasma 140 towards the workpiece 138 for implantation as indicated by arrow 195 during the pulse ON periods of the pulsed platen signal. The ions may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy. The duration of the pulsed platen signal may be varied to control overall dose.

Advantageously, a monitoring system including at least one IMS 192 is configured to monitor a condition of the plasma 140 and provide a signal to the controller 156 representative of the same. The IMS 192 may continuously monitor a condition of the plasma 140 while ions from the plasma are directed towards the workpiece 138. The condition of the plasma may include a neutral composition of the plasma and/or an ion composition of the plasma. For example, the neutral composition may include identification of any uncharged or neutral particles. When the feed gas is $BF_3$, such neutral particles may include, but not be limited to, $BF_3$ itself and radicals such as $BF_2$ and BF.

The controller 156 may control one or more process parameters of the plasma doping system in response thereto to achieve output functions. Output functions may include, but are not limited to, ion dose correction, dose uniformity control, plasma chamber conditioning, and/or process fault detection. To accomplish such output functions, the controller 156 may adjust the RF power via the power supply 150, the pressure inside the chamber 102 via the gas pressure controller 116, the flow rate of the feed gas via the mass flow controller 106, and/or the substrate temperature via a heating/cooling mechanism (not illustrated) to name only several adjustable parameters. Signals from the IMS 192 at one or more positions 192', 192'', and 192''' may also be used to confirm proper functioning of the tool, e.g., "fingerprinting." In addition, in response to fault detection (for example, detection of nitrogen from a vacuum leak), the controller 156 may trigger an alarm condition via the user interface system 158 and may also suspend or halt operation of the plasma doping system. In addition, signals from the IMS 192 can be used to monitor vacuum recovery after a preventative maintenance (PM) routine and determine when the process chamber 102 is ready for processing. Thus, this minimizes the number of warm-up wafers needed and the recovery time. In addition, signals from the IMS 192 can be used to determine an endpoint for a chamber cleaning procedure.

In one embodiment, an output from the IMS 192 is representative of a neutral composition of the plasma 140. The controller 156 may be responsive to the neutral composition monitored by the IMS 192 to control deposition on the workpiece 138 by adjusting a process parameter of the plasma processing apparatus 100. The process parameter may include, but not be limited to, the RF power via the power supply 150, the pressure inside the processes chamber 102 via the gas pressure controller 116, the flow rate of the feed gas via the mass flow controller 106, and the feed gas composition input to the process chamber.

Another IMS 192 located at position 192'''' may monitor the concentration of feed gas provided by the gas source 104 and provide a signal to the controller 156 representative of the same. The controller 156 may coordinate with the gas pressure controller 116 to maintain a desired concentration of gas in response to the signal from the IMS 192 at this position 192''''.

Figure 2:
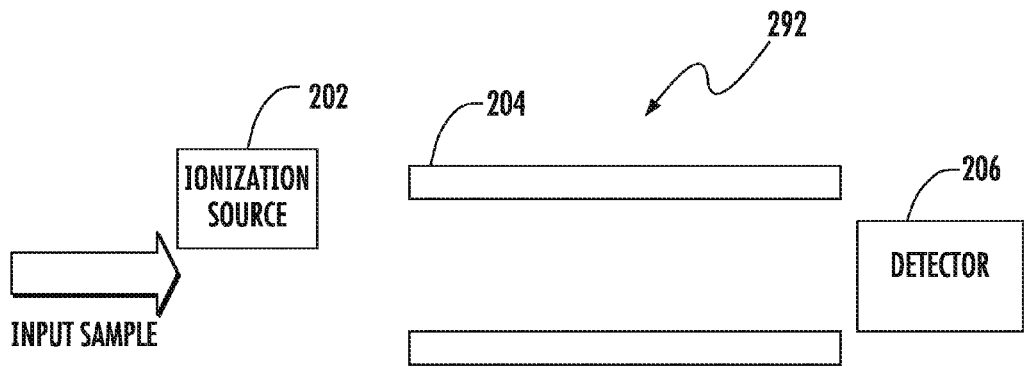
FIG. 2 is a block diagram of a standard ion mobility sensor.

Turning to FIG. 2, a block diagram of a standard IMS 292 is illustrated. In one embodiment, the standard IMS 292 may be the IMS 192 in the various positions illustrated in FIG. 1. The standard IMS 292 may include an ionization source 202, a drift tube 204, and a detector 206. In general, the standard IMS separates ions based on their different drift times in the drift tube 204 due to their interactions with a buffer gas in the drift tube as the ions are accelerated by a constant and uniform electric field. Neutrals entering the standard IMS 292 are ionized by the ionization source 202 prior to entering a drift region defined by the drift tube 204. The ionization source 202 may be a radioactive source such as a nickel ($^{63}$Ni) or americium source ($^{243}$Am). Different species may have different collision cross sections and drift times to enable detection of different species. The IMS 292 may have detection limits in the parts per trillion at atmospheric pressure, with a high mass resolution.

The standard IMS 292 also tends to be significantly more compact than traditional mass spectrometers. The standard IMS 292 can also work over a wide pressure range including atmospheric pressure. This makes the standard IMS 292 suitable for in-situ or near in-situ real time monitoring of ions and/or neutral species composition in the process plasma chamber 102. The gas filing the standard IMS drift region could be the process gas from the chamber 102 or gas from a separate source 199 (see FIG. 1). The separate gas source 199 illustrated with the IMS at position 192''' could be, for example, a helium gas source. The standard IMS 292 can also distinguish between two ions of the same mass but different composition since it is sensitive to different collision cross sections. In contrast, a time-of-flight sensor can not distinguish between two ions of separate species but the same mass since the flight time would be the same.

Figure 3:
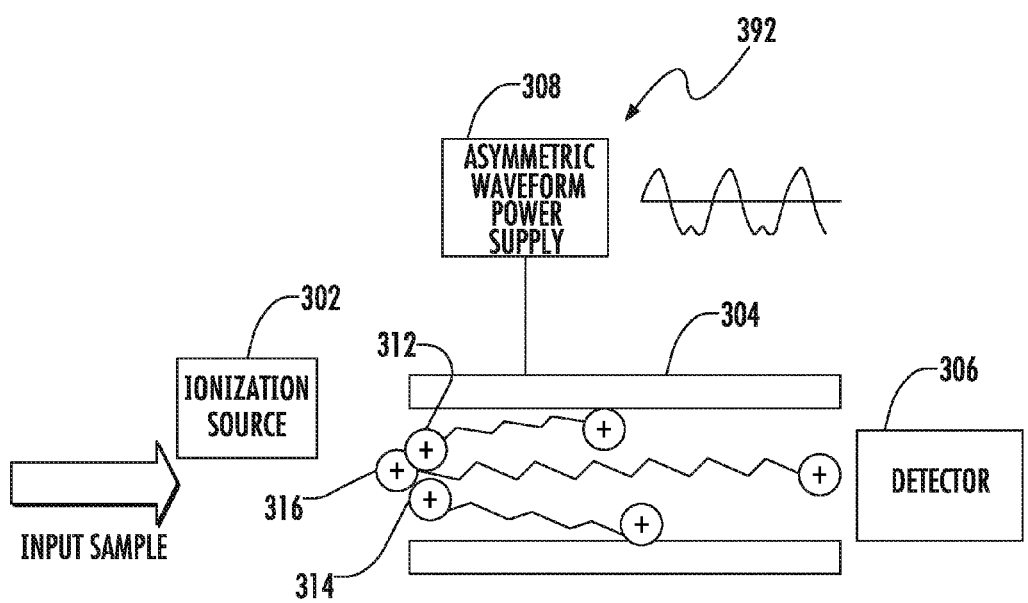
FIG. 3 is a block diagram of a field asymmetric ion mobility spectrometer.

Turning to FIG. 3, a block diagram of a field asymmetric ion mobility spectrometer (FAIMS) 392 is illustrated. In one embodiment, the standard FAIMS 392 may be the IMS 192 in the various positions illustrated in FIG. 1. The FAIMS is somewhat similar to the standard IMS 292. However, the FAIMS 392 filters out undesired ions by using an asymmetric waveform power supply 308 to supply an asymmetric waveform to the drift tube 304. Therefore, certain undesired ions such as ions 312, 314 are attracted to the drift tube 304 and end up striking the same. Such ions 312, 314 that strike the drift tube are lost and are not monitored by the detector 306. Therefore, the FAIMS 392 essentially employs the asymmetric waveform to select ions of interest in the drift tube 304. The FAIMS 392 typically allows for higher resolution and sensitivity than the standard IMS 292.

Depending on the location of the IMS 192, it may be adapted to operate at a lower pressure level expected in its operating environment. For example, at position 192''' proximate the exhaust port 110, the IMS 192 should be adapted to operate at the lower pressure levels anticipated within the interior volume 103 of the process chamber 102. In one instance, this pressure may be on the order of about 5 to 20 milliTorr.

Figure 4:
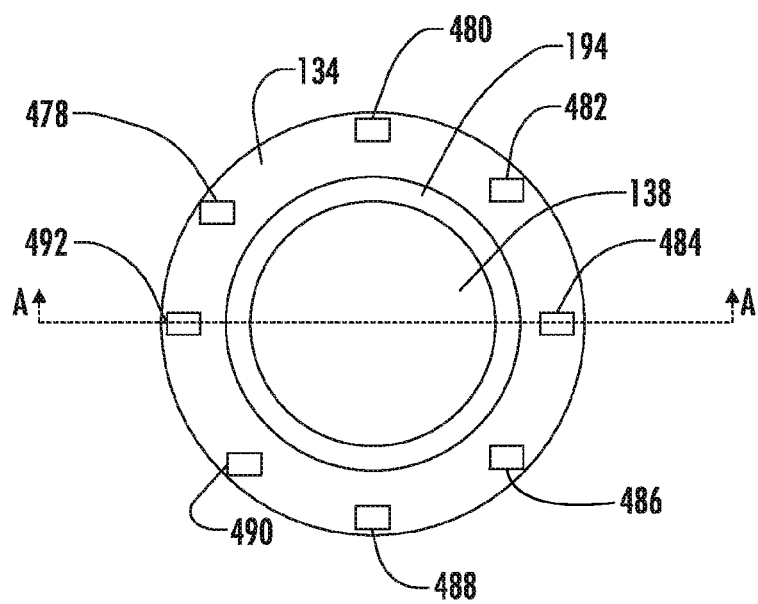
FIG. 4 is a plan view of a platen assembly illustrating a plurality of ion mobility spectrometers positioned about a periphery of a disk shaped workpiece.
Figure 5:
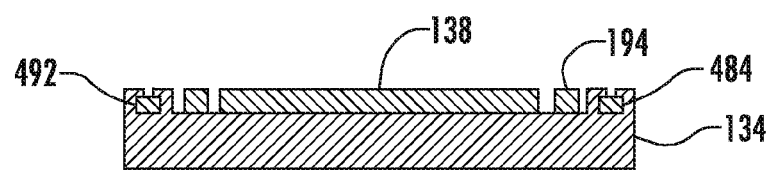
FIG. 5 is a cross sectional view of the platen assembly of FIG. 4 taken along the line A-A of FIG. 4.

Turning to FIG. 4, a plan view of a platen assembly supporting a disk shaped workpiece 138 is illustrated. A plurality of IMSs 478, 480, 482, 484, 486, 488, 490, 492 may be positioned about a periphery of the workpiece 138. FIG. 5 is a cross sectional view of the platen assembly of FIG. 4 taken along the line A-A of FIG. 4. In the embodiment of FIGS. 4 and 5, the IMSs may be positioned in the platen 134. The size of the IMSs enables a plurality of them to be positioned in desired locales in the process chamber. In the embodiment of FIGS. 4 and 5, eight IMSs are equally spaced about the periphery of the workpiece 134 allowing the output of each to be compared and contrasted by the controller 156 to provide information on the uniformity of the plasma 140 in the chamber 102. A similar output from each IMS is indicative of a high uniformity of the plasma. Other embodiments may have differing numbers of IMSs and position them in different locales.

Accordingly, there is provided a plasma processing apparatus having at least one ion mobility spectrometer (IMS) 192 for monitoring plasma conditions and/or conditions of a feed gas. Advantageously, this monitoring system allows control of deposition on the workpiece and/or sputtering during processing. It also allows control of implant uniformity on the workpiece and plasma uniformity. In addition, monitoring the feed gas allows control of process gas concentration which assists in obtaining repeatable and stable process results.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing apparatus comprising:
   a process chamber;
   a platen positioned in the process chamber for supporting a workpiece;
   a source configured to generate a plasma in the process chamber;
   a monitoring system comprising a plurality of ion mobility spectrometers positioned about a periphery of the workpiece to monitor a condition of the plasma, and a controller to compare an output from each of the plurality of ion mobility spectrometers to determine a uniformity of the plasma; and
   a bias source to bias the workpiece to attract ions from the plasma towards the workpiece, and wherein the plurality of ion mobility spectrometers are further configured to continuously monitor the condition of the plasma while ions from the plasma are directed towards the workpiece.

2. The plasma processing apparatus of claim 1, wherein the condition comprises a neutral composition of the plasma.

3. The plasma processing apparatus of claim 1, wherein the condition comprises an ion composition of the plasma.

4. The plasma processing apparatus of claim 1, wherein the controller is further configured to adjust a process parameter of the plasma processing apparatus in response to the condition of the plasma.

5. The plasma processing apparatus of claim 1, wherein the workpiece has a disk shape, and the plurality of ion mobility spectrometers comprises at least eight ion mobility spectrometers equally spaced about the periphery of the workpiece.

6. The plasma processing apparatus of claim 1, wherein the controller is further configured to adjust a process parameter of the plasma processing apparatus in response to the uniformity of the plasma.

7. The plasma processing apparatus of claim 1, wherein the condition comprises a neutral composition of the plasma, and the controller is further configured to adjust a process parameter of the plasma processing apparatus in response to the neutral composition to control deposition on the workpiece.

8. A plasma processing apparatus comprising:
   a process chamber;
   a platen positioned in the process chamber for supporting a workpiece;
   a source configured to generate a plasma in the process chamber; and
   a monitoring system comprising an ion mobility spectrometer configured to monitor a condition of the plasma and a second ion mobility spectrometer positioned to monitor a condition of a feed gas provided to the process chamber.

9. The plasma processing apparatus of claim 8, wherein the condition of the feed gas comprises a concentration of the feed gas, and further comprising a controller to adjust the concentration of the feed gas in response to an output of the second ion mobility spectrometer.

10. A monitoring method comprising:
    generating a plasma in a process chamber of a plasma processing apparatus;
    supporting a workpiece on a platen in the process chamber;
    monitoring a condition of the plasma with an ion mobility spectrometer; and
    monitoring a condition of a feed gas provided to the process chamber with a second ion mobility spectrometer.

11. The monitoring method of claim 10, wherein the condition of the plasma comprises a neutral composition of the plasma.

12. The monitoring method of claim 11, further comprising: attracting ions from the plasma towards the workpiece; and adjusting a process parameter of the plasma processing apparatus in response to the condition monitored by the ion mobility spectrometer.

13. The monitoring method of claim 11, further comprising:
    implanting ions from the plasma into the workpiece; and
    adjusting a process parameter of the plasma processing apparatus in response to the neutral composition monitored by the ion mobility spectrometer to control deposition on the workpiece.

14. The monitoring method of claim 10, wherein the condition of the feed gas comprises a concentration of the feed gas, and further comprising adjusting the concentration of the feed gas in response to an output of the second ion mobility spectrometer.

* * * * *